United States Patent [19]
Garant et al.

[11] Patent Number: 5,700,549
[45] Date of Patent: Dec. 23, 1997

[54] STRUCTURE TO REDUCE STRESS IN MULTILAYER CERAMIC SUBSTRATES

[75] Inventors: John J. Garant, Hopewell Junction; Richard F. Indyk, Wappingers Falls, both of N.Y.

[73] Assignee: International Business Machines Corporation, Armonk, N.Y.

[21] Appl. No.: 668,668

[22] Filed: Jun. 24, 1996

[51] Int. Cl.[6] .................. B32B 3/00; H05K 7/20
[52] U.S. Cl. ................... 428/210; 428/209; 361/711
[58] Field of Search ...................... 428/210, 209; 361/711

[56] References Cited

U.S. PATENT DOCUMENTS

| | | | |
|---|---|---|---|
| 5,093,186 | 3/1992 | Kimura et al. | 428/209 |
| 5,130,498 | 7/1992 | Yoshida et al. | 174/252 |
| 5,293,503 | 3/1994 | Nishigoori | 174/250 |
| 5,354,599 | 10/1994 | McClanahan et al. | 428/210 |
| 5,451,720 | 9/1995 | Estes et al. | 174/250 |
| 5,453,913 | 9/1995 | Koyanagi | 361/81 |

OTHER PUBLICATIONS

IBM Technical Disclosure Bulletin, vol. 20, No. 4, Sep. 1977 "Dummy Pads For Increased Creep Resistance".

IBM Technical Disclosure Bulletin, vol. 20, No. 11B, Apr. 1978, "Via Design Minimize Stress Levels In Multilayer Ceramic Substrates".

*Primary Examiner*—Cathy F. Lam
*Attorney, Agent, or Firm*—DeLio & Peterson, LLC; Peter W. Peterson; Aziz M. Ahsan

[57] ABSTRACT

A multilayer ceramic substrate for microelectronics includes stress relief pads to reduce stress in the vicinity of functional vias penetrating through multiple ceramic layers. The stress relief pads are located only on the major surface of a ceramic layer and accordingly do not prevent wiring from being placed directly below the stress relief pads on the bottom surface of the same layer or the top surface of the imediately underlying layer. The invention also includes the method of making the multilayer ceramic substrate with stress relief pads.

10 Claims, 2 Drawing Sheets

STRUCTURE TO REDUCE STRESS IN MULTILAYER CERAMIC SUBSTRATES

BACKGROUND OF THE INVENTION

1. Field of the Invention

This invention relates to multilayer ceramic substrates used for fabricating microelectronic circuits and to stress release structures incorporated in such substrates to reduce stress and prevent cracking.

2. Description of Related Art

Multilayer ceramic substrates are typically formed by stacking and bonding together flexible sheets, commonly referred to as ceramic green sheets. Green sheet segments of desired size and configuration are punched to form vias which provide vertical interconnections between adjacent green sheet layers. A screen printing technique is then used to apply a conductive paste which fills the via holes and forms conductive circuit patterns on the face of the green sheets. After screening, the green sheets are assembled into a stack, laminated together and subsequently sintered in an oven at a high temperature.

After sintering, a rigid unitary ceramic body results which includes an interior interconnected conductive pattern. Horizontal conductors, i.e. wires, have been formed by the horizontally applied patterns of the conductive metal paste and vertical connections between selected layers have been formed by the filled via holes.

The most commonly used conductive paste is a molybdenum containing paste. Pastes containing tungsten are also commonly used. Unfortunately, however, such metal pastes produce conductive wires and vias which have a thermal coefficient of expansion that is less than the thermal coefficient of expansion of ceramic. As a result, stresses are built up in the multilayer ceramic substrate during the sintering process, particularly during the sintering cool down cycle. During cooling, the ceramic is put into tension near any metal feature, making it prone to failure by cracking. The problem is most acute near the vias.

Vias of the type described above penetrate vertically through one or more ceramic layers to interconnect wiring on different layers. This type of via is referred to herein as a "functional via", i.e., a via which conducts electronic signals and current from one part of the substrate to another. Another type of via is referred to herein as a "stress relief via", but may also be known as a "non-functional via", a "dummy via" or a "sacrificial via".

A stress relief via is a via placed in the ceramic in order to redistribute the stress in the ceramic in a desired way, usually to reduce stress and prevent cracking in the ceramic. A common use for stress relief vias is to place them in a flanking relationship to functional vias or between functional vias to reduce the tendency of the ceramic to form cracks between the functional vias.

There is an ever present pressure to increase the density of wiring on multilayer ceramic substrates and to reduce the number of layers. This creates a difficulty with stress relief vias because they take up valuable space on the ceramic substrate that might be used for other conductive features. Because stress relief vias penetrate completely through at least one ceramic layer, they use the space not only on the layer they penetrate, but also on the layer that is directly below. Where large numbers of stress relief vias are used, the space available for wiring on the layers is significantly reduced by this double layer use of space.

Stress relief vias have previously been used in the design of the top surface, metallurgy of multilayer ceramic substrates. In the pursuit of thinner packages with fewer layers, however, chip designers have been putting more and more functional metal, for example ground and voltage mesh, on the back side of the top layer. Top surface via patterns, which would normally require the inclusion of stress relief vias, have metallurgy on the bottom of the upper layer in the locations where the stress relief vias would normally be punched, thus, precluding their use.

Control over thermal expansion mismatch between functional vias and the surrounding ceramic has also been achieved through the use of highly gritted conductive pastes used to form metallurgical structures. However, a highly gritted metal feature has the distinct disadvantage of reduced electrical conductivity as compared to pure metal.

Consequently, one object of the present invention is to permit the use of pure metal or low grit content conductive structures with additional stress relief structures to prevent cracking in the ceramic.

Another object of the invention is to provide stress relief structures on the upper surface of a ceramic layer which includes metallurgy on the bottom layer.

Yet another object of the present invention is to provide a multilayer ceramic substrate and a method of making such a substrate which provides stress relief structures between functional vias, but which allows wiring to be placed directly beneath the stress relief structure and which allows for a greater wiring density.

Yet another object of the invention is to reduce manufacturing losses in multilayer ceramic substrate construction due to cracking.

A further object of the invention is to provide thinner multilayer ceramic substrates.

SUMMARY OF THE INVENTION

The above and other objects, which will be apparent to those skilled in the art, are achieved in the present invention which in one aspect relates to a multilayer ceramic substrate for microelectronics in which a plurality of ceramic layers are arranged in sequential layers, each layer having a major surface. A plurality of electrically conductive wires are formed on the major surfaces of the ceramic layers and a plurality of electrically conductive functional vias, each functional via extending through one or more of the ceramic layers, electrically interconnect the wires. A plurality of stress relief pads are formed on the major surfaces of the ceramic layers in the vicinity of selected ones of the functional vias. The stress relief pads reduce stress in the ceramic layers in the vicinity of the functional vias.

Another aspect of the present invention provides a method of making a multilayer ceramic substrate having reduced stress. The method includes the steps of arranging a plurality of ceramic layers in sequential layers, each layer having a major surface, and forming a plurality of electrically conductive wires on the major surfaces of the ceramic layers. A plurality of electrically conductive functional vias are also formed, each functional via extending through one or more of the ceramic layers and electrically connecting to one or more of the wires. A plurality of stress relief pads are created on the major surfaces of the ceramic layers in the vicinity of selected ones of the functional vias. The stress relief pads reduce stress in the ceramic layers in the vicinity of the selected ones of the functional vias.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–8 of the drawings in which like numerals refer to like features of the invention.

Figure 2:
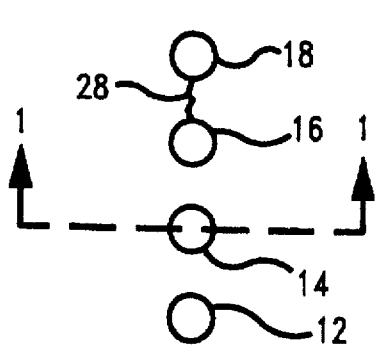
FIG. 2 is a top plan view seen from the direction 2—2 in FIG. 1 of a prior art functional via array including a stress crack.
Figure 1:
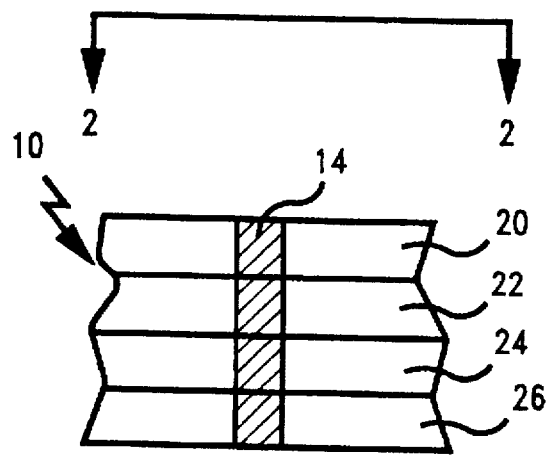
FIG. 1 is a partial cross-sectional view of a portion of a multilayer ceramic substrate incorporating a prior art functional via.

A better understanding of the present invention will be obtained through an understanding of the prior art shown in FIGS. 1–4. FIGS. 1 and 2 illustrate cross-sectional and top plan views, respectively, of a linear array of functional vias located in a multilayer ceramic substrate 10. The functional vias include vias 12, 14, 16 and 18. The functional via 14 shown in the cross-section of FIG. 1 penetrates from the upper ceramic layer 20 through intermediate ceramic layers 22 and 24 to bottom ceramic layer 26. Functional via 14 and the other functional vias are used to interconnect wiring on layers 20, 22, 24 and 26 where desired. Wires on those layers may run horizontally to other vias and/or other metal structures on the ceramic substrate providing the desired electrical interconnections.

Due to the thermal expansion coefficient mismatch between the metallic structures (e.g. vias and wiring) and the ceramic itself, stress cracks, such as stress crack 28, may develop in the vicinity of functional vias, such as between vias 16 and 18. The development of stress cracks depends upon the level of stress, the size of any flaws in the ceramics and other factors.

Figure 4:
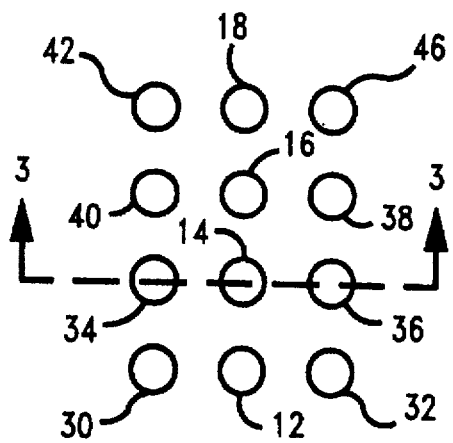
FIG. 4 is a top plan view seen from the direction 4—4 in FIG. 3 showing an array of functional vias and stress relief vias.
Figure 3:
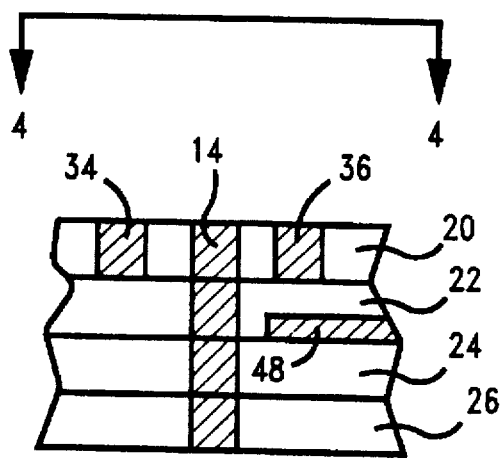
FIG. 3 is a partial cross-sectional view along the line 3—3 in FIG. 4 of a prior art multilayer ceramic substrate incorporating a functional via and a pair of flanking stress relief vias.

One solution to stress cracks has been the use of highly gritted paste during the screening operation which has the undesirable side effect of reducing conductivity of the metal structures. Accordingly, an alternative prior art method of dealing with cracking is illustrated in FIGS. 3 and 4 which show stress relief vias. In FIGS. 3 and 4, functional via 14 has been protected by stress relief vias 34 and 36 which flank functional via 14. Functional vias 12, 16 and 18 have been correspondingly protected by pairs of stress relief vias 30, 32, 38, 40, 42 and 46, as shown in FIG. 4. The stress relief vias redistribute and reduce stress in the ceramic during cooling to prevent cracking.

As can be seen in FIG. 3, however, the prior art stress relief vias 34, 36 penetrate completely through upper ceramic layer 20 and thereby preclude the use of functional wiring or other metallic structures on the interface surface between layers 22 and 20. The first layer upon which wiring may be used below the stress relief vias is at the interface between layers 22 and 24 as illustrated by wiring 48 shown below stress relief via 36.

Where large numbers of stress relief vias are used, a substantial portion of available wiring space is precluded from use, with the upper layer 20 being substantially devoted to the stress relief vias which correspondingly preclude the use of the space below them for wiring. The net result is to require one additional layer in the multilayer ceramic substrate. Each layer, however, introduces additional cost and complexity.

Figure 6:
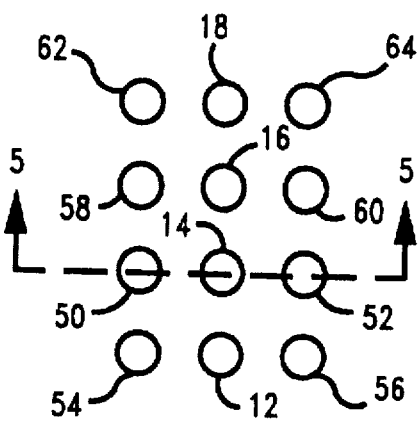
FIG. 6 is a top plan view seen from the direction 6—6 in FIG. 5 of the multilayer ceramic substrate of the present invention.
Figure 5:
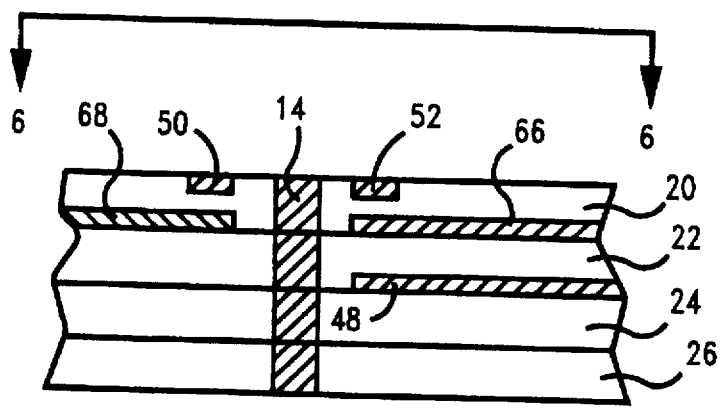
FIG. 5 is a partial cross-sectional view along the line 5—5 in FIG. 6 of a portion of a multilayer ceramic substrate in accordance with the present invention showing a functional via and two stress relief pads located on opposite sides of the functional via overlying wiring directly below.

A solution has been found by the use of stress relief pads, such as stress relief pads 50, 52, shown in FIGS. 5 and 6, which protect functional via 14. Corresponding stress relief pads 54, 56, 58, 60, 62 and 64 protect functional vias 12, 16 and 18. The term "stress relief pad" as described herein includes a metal structure applied to one side of a ceramic layer, such as the upper surface of ceramic layer 20, but which does not penetrate completely through the layer so as to preclude the use of wiring on the bottom surface of the same layer or the upper surface of the layer below.

As can be seen in FIG. 5, the stress relief pad 52 is applied only to the upper surface of layer 20 and, consequently, permits a metal structure, such as wire 66, to be located at the interface between layers 20 and 22. Through a comparison with FIG. 3, it can be seen that the use of stress relief pad 52, instead of prior art stress relief via 36, permits an additional layer of wiring between the stress relief structure and wire 48. Similarly, stress relief pad 50 may be located directly over another metal structure 68. A preferred location for stress relief pads according to the invention is at the midpoint between two functional vias.

Figure 8:
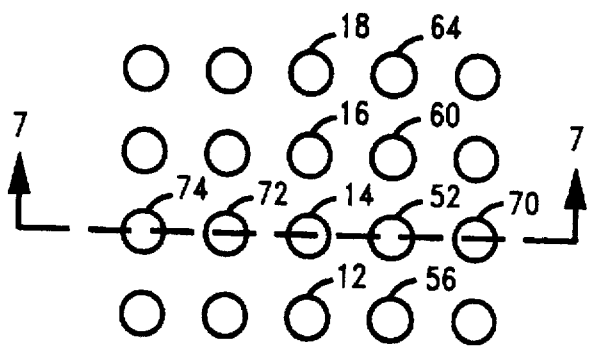
FIG. 8 is a top plan view of the multilayer ceramic substrate shown in FIG. 7.
Figure 7:
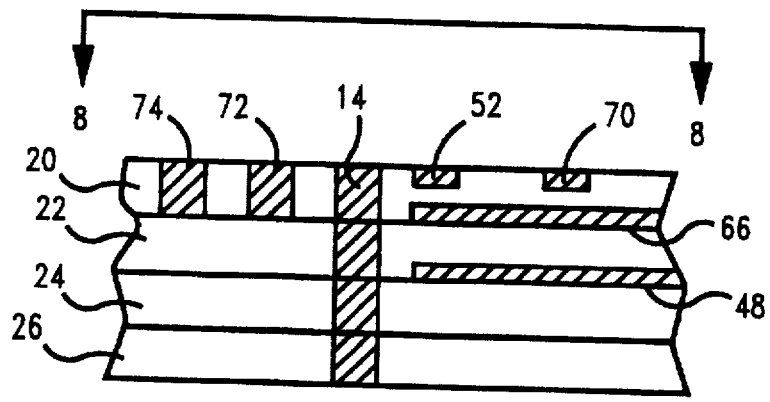
FIG. 7 is a partial cross-sectional view along the line 7—7 in FIG. 8 of a multilayer ceramic substrate in accordance with the present invention showing a functional via protected by a pair of stress relief vias on one side and a pair of stress relief pads on the other side directly overlying wiring below.

FIGS. 7 and 8 illustrate additional improvements to the invention in which pairs of stress relief pads, such as stress relief pad pair 52, 70 are used to provide even greater stress relief than is provided with a single stress relief pad. FIG. 7 also illustrates that single or multiple stress relief pads, such as stress relief pad pair 52, 70, may be used in combination with one or more stress relief vias, such as stress relief vias 72, 74 of FIG. 7.

Mechanical stress modeling has determined that the magnitude of stress reduction afforded by pads such as those shown in FIGS. 5–8 is about 5%. Stress relief vias, on the other hand, typically afford about a 20% reduction in stress, and may be preferred where stress is particularly high or where they are permitted by the absence of wiring directly below them. Consequently, a practical designer will use a combination of stress relief pads and stress relief vias in appropriate situations to optimize stress reduction without unduly interfering with wiring requirements.

The stress relief pads are preferably formed of the same metal as the functional vias, and most preferably are conventionally formed by the use of a metal paste screened onto a green sheet in the known manner.

The present invention also includes a method of making a multilayer ceramic substrate having reduced stress as described above. The method includes arranging a plurality of ceramic layers in sequential layers, preferably by aligning a plurality of green sheets. A plurality of electrically conductive wires are formed on the major surfaces of the ceramic layers, most preferably by screening a conductive paste such as a molybdenum paste to form the wires. A plurality of electrically conductive functional vias are then formed, each functional via extending through one or more of the ceramic layers and electrically connecting to one or more of the wires.

The functional vias are most preferably formed in the known manner by punching the green sheets and screening an electrically conductive metal paste into the punched openings which, when aligned, form a functional via in the sintering process producing the multilayer ceramic substrate. A plurality of stress relief pads are also formed on the major surfaces of the ceramic layers in the vicinity of the functional vias to reduce stress in the ceramic layers. The stress relief pads are located only on one surface, usually the upper surface, and consequently do not restrict wiring in the ceramic layers directly below the stress relief pad. The stress relief pads are preferably formed in the same way as the electrically conductive wires by screening the pad onto the surface of a green sheet and without punching the green sheet.

The method may also include forming multiple stress relief pads in combination with other stress relief pads or in combination with conventional stress relief vias to optimize stress reduction without interfering with desired wiring in the layers below.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A multilayer ceramic substrate for microelectronics comprising:

a plurality of ceramic layers arranged in sequential layers, each layer having a major surface;

a plurality of electrically conductive wires formed on the major surfaces of the ceramic layers;

a plurality of electrically conductive functional vias, each functional via extending through one or more of the ceramic layers and electrically connecting to one or more of the wires; and a plurality of stress relief pads formed on the major surface of at least one of the ceramic layers in the vicinity of selected ones of the functional vias, the stress relief pads reducing stress formed in the at least one of the ceramic layers during ceramic sintering manufacturing steps as a result of thermal coefficient of expansion differences between the selected ones of the functional vias and the ceramic substrate.

2. A multilayer ceramic substrate for microelectronics according to claim 1 wherein the stress relief pads comprise circular pads.

3. A multilayer ceramic substrate for microelectronics according to claim 1 wherein the stress relief pads are formed of molybdenum.

4. A multilayer ceramic substrate for microelectronics according to claim 1 wherein at least one stress relief pad is located directly above a wire located directly below said at least one stress relief pad.

5. A multilayer ceramic substrate for microelectronics according to claim 1 wherein the plurality of stress relief pads are located at midpoints between pairs of the functional vias.

6. A multilayer ceramic substrate for microelectronics according to claim 1 further comprising a plurality of stress relief vias located in the vicinity of the selected ones of the functional vias, the stress relief vias further reducing stress in the ceramic layers in the vicinity of the selected ones of the functional vias.

7. A multilayer ceramic substrate for microelectronics according to claim 6 wherein the stress relief vias extend through a single one of the ceramic layers.

8. A multilayer ceramic substrate for microelectronics according to claim 6 wherein the stress relief vias are located on an opposite side of the functional vias from corresponding ones of the stress relief pads.

9. A multilayer ceramic substrate for microelectronics according to claim 1 wherein multiple ones of the stress relief pads are located in the vicinity of each of the selected ones of the functional vias to further reduce stress in the ceramic layers between the functional vias.

10. A multilayer ceramic substrate for microelectronics according to claim 9 further comprising a plurality of stress relief vias located in the vicinity of the selected ones of the functional vias, and wherein multiple ones of the stress relief vias are located in the vicinity of the selected ones of the functional vias.

* * * * *